United States Patent
Itokawa et al.

(10) Patent No.: US 7,247,867 B2
(45) Date of Patent: Jul. 24, 2007

(54) ION IMPLANTER AND METHOD OF MANUFACTURING SEMICONDUCTOR DEVICE

(75) Inventors: Hiroshi Itokawa, Yokohama (JP); Yoshimasa Kawase, Yokohama (JP); Kyoichi Suguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 217 days.

(21) Appl. No.: 11/170,171

(22) Filed: Jun. 30, 2005

(65) Prior Publication Data

US 2006/0017017 A1 Jan. 26, 2006

(30) Foreign Application Priority Data

Jun. 30, 2004 (JP) ............................ 2004-193034

(51) Int. Cl.
*G01N 23/00* (2006.01)
*G01N 21/00* (2006.01)
*A61N 5/00* (2006.01)
*H01J 37/08* (2006.01)

(52) U.S. Cl. .......................... 250/492.21; 250/492.22; 250/492.2; 250/492.3; 250/492.1; 250/491.1

(58) Field of Classification Search ............ 250/492.21
See application file for complete search history.

(56) References Cited

U.S. PATENT DOCUMENTS

| | | | | |
|---|---|---|---|---|
| 4,851,693 A | * | 7/1989 | Fisher | 250/492.3 |
| 5,831,273 A | * | 11/1998 | Someda et al. | 250/492.22 |
| 6,329,664 B1 | * | 12/2001 | Mihira | 250/492.21 |
| 6,806,479 B1 | * | 10/2004 | Wan et al. | 250/492.21 |
| 6,833,552 B2 | * | 12/2004 | Berrian | 250/492.3 |
| 7,057,192 B2 | * | 6/2006 | Kaim et al. | 250/492.21 |
| 7,135,691 B2 | * | 11/2006 | Vanderpot et al. | 250/492.1 |
| 7,141,809 B2 | * | 11/2006 | Vanderpot et al. | 250/492.21 |

(Continued)

FOREIGN PATENT DOCUMENTS

JP      04-022900      1/1992

(Continued)

OTHER PUBLICATIONS

Yoneda et al., "The Drain Current Asymmetry of 130 nm MOSFET's due to Extension Implant Shadowing Originated by Mechanical Angle Error in High Current Implanter," Extended Abstracts of International Workshop on Junction Technology (2002), pp. 19-22.

*Primary Examiner*—Robert Kim
*Assistant Examiner*—Bernard Souw
(74) *Attorney, Agent, or Firm*—Finnegan, Henderson, Farabow, Garrett & Dunner, L.L.P.

(57) ABSTRACT

An ion implanter includes a sample stage for setting a sample having a main surface, an ion generating section configured to generate a plurality of ions, the ion generating section including a container into which an ion source gas is introduced and a filament for emitting thermal electrons provided in the container, an implanting section configured to implants an ion beam containing the plurality of ions in the main surface of the sample, and a control section configured to control a position of the sample or a spatial distribution of electrons emitted from the filament so that a direction of eccentricity of a center of gravity of the ion beam coincides with a direction of a normal line of the main surface.

15 Claims, 9 Drawing Sheets

U.S. PATENT DOCUMENTS

2002/0105066 A1* 8/2002 Eikyu et al. ................. 257/685
2002/0137299 A1* 9/2002 Tseng et al. ................. 438/373
2005/0230643 A1* 10/2005 Vanderpot et al. ..... 250/492.21
2006/0017017 A1* 1/2006 Itokawa et al. ........ 250/492.21

FOREIGN PATENT DOCUMENTS

JP 04-209523 7/1992

* cited by examiner

ION IMPLANTER AND METHOD OF MANUFACTURING SEMICONDUCTOR DEVICE

CROSS-REFERENCE TO RELATED APPLICATIONS

This application is based upon and claims the benefit of priority from prior Japanese Patent Application No. 2004-193034, filed Jun. 30, 2004, the entire contents of which are incorporated herein by reference.

BACKGROUND OF THE INVENTION

1. Field of the Invention

The present invention relates to an ion implanter and a method of manufacturing a semiconductor device including an ion implanting process.

2. Description of the Related Art

In recent years, large scale integrated circuits (LSI) have often been used in important parts of computers and communication apparatuses; the large scale integrated circuits are formed by connecting a large number of transistors and resistors together as electric circuits and integrating the circuits together on one chip. Thus, the performance of the whole apparatus depends strongly on the performance of a single LSI. The performance of the single LSI can be improved by increasing the degree of integration, that is, miniaturizing the elements.

Miniaturization of elements can be formed by reducing the junction depth of a diffusion layer, for example, a source/drain diffusion layer. The junction depth can be reduced by optimizing ion implantation and the subsequent heat treatment step (annealing). This serves to realize, for example, a MOS transistor having a shallow source/drain diffusion layer of junction depth not higher than 0.2 µm.

To form a shallow diffusion layer by doping impurities, it is necessary to make a reduced heat budget so as to shallowly distribute impurity atoms during ion implantation and to prevent the impurity atoms from diffusing deeply during the subsequent heat treatment. Further, to use impurity doping to form wells in which elements such as MOS transistors are formed and areas (channel doping layers) in which channels of MOS transistors are induced, it is necessary to accurately control the amount of impurities implanted.

On the other hand, with a miniaturization of elements, for example, a reduction in gate processing size, offset is more likely to occur in a source/drain area owing to shadowing of a gate electrode and deviation of the incident angle of ion beam. Such offset makes notable transistor characteristics asymmetric.

A cone angle has been considered to be the cause of the asymmetry of the transistor characteristics which may occur if a batch type high current ion implanter is used. Thus, attempts have been made to eliminate the asymmetry of the transistor characteristics by adjusting an α angle and a β angle (Extended Abstracts of International Workshop on Junction Technology 2002, S2-3.).

However, at present, the asymmetry of the transistor characteristics is not necessarily eliminated simply by adjusting the α and β angles.

BRIEF SUMMARY OF THE INVENTION

An ion implanter according to an aspect of the present invention comprises a sample stage for setting a sample having a main surface; an ion generating section which generates a plurality of ions, the ion generating section including a container into which an ion source gas is introduced and a filament for emitting thermal electrons provided in the container; an implanting section which implants an ion beam containing the plurality of ions in the main surface of the sample; and a control section which controlles a position of the sample or a spatial distribution of electrons emitted from the filament so that a direction of eccentricity of a center of gravity of the ion beam coincides with a direction of a normal line of the main surface.

A method of manufacturing a semiconductor device according to an aspect of the present invention comprises generating a plurality of ions by an ion generating section including a container into which an ion source gas is introduced and a filament for emitting thermal electrons provided in the container, the plurality of ions being generated in the container; controlling a position of a sample or a spatial distribution of electrons emitted from the filament so that a direction of eccentricity of the center of gravity of ion beam containing the plurality of ions coincides a direction of a normal of a main surface; and implanting the ion beam into the main surface of the sample set on a sample stage.

DETAILED DESCRIPTION OF THE INVENTION

Embodiments of the present invention will be described below with reference to the drawings.

FIRST EMBODIMENT

Figure 1:
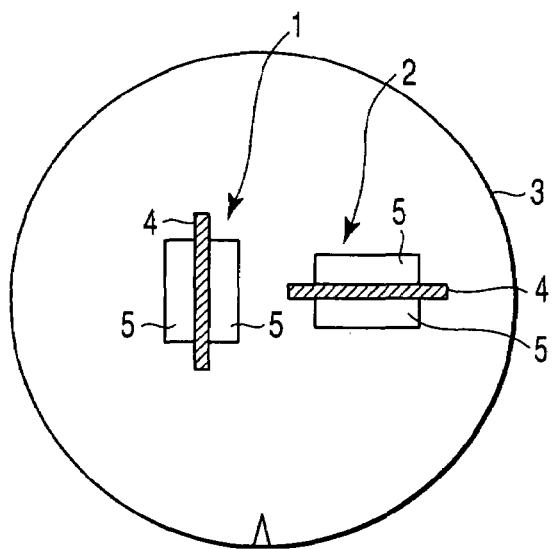
FIG. 1 is a diagram schematically showing a semiconductor wafer on which a vertical MOS transistor and a horizontal MOS transistor are formed.

FIG. 1 is a diagram schematically showing a semiconductor wafer 3 on which a vertical MOS transistor 1 and a horizontal MOS transistor 2 are formed. Each of the vertical MOS transistor 1 and horizontal MOS transistor 2 comprises a gate electrode 4 and a source/drain diffusion layer 5. The vertical MOS transistor 1 and the horizontal MOS transistor 2 have a gate length (channel length) of not higher than 65 nm. The semiconductor wafer 3 is, for example, a Si wafer.

Studies by the present inventors indicate that a gate length (channel length) of not higher than 65 nm makes the asymmetry of the characteristics of the horizontal MOS transistor 2 more significant and that the asymmetry of the characteristics of the horizontal MOS transistor 2 cannot be sufficiently eliminated by adjusting the α and β angles.

The cause of the asymmetry of the transistor characteristics has been found to be a variation in the incident angle of ion beam, caused by eccentricity of the center of the gravity of the ion beam. Moreover, the eccentricity of the center of the gravity of the ion beam is considered to result from the spatial distribution of thermal electrons emitted from a cathode filament in an ion source chamber.

Figure 2:
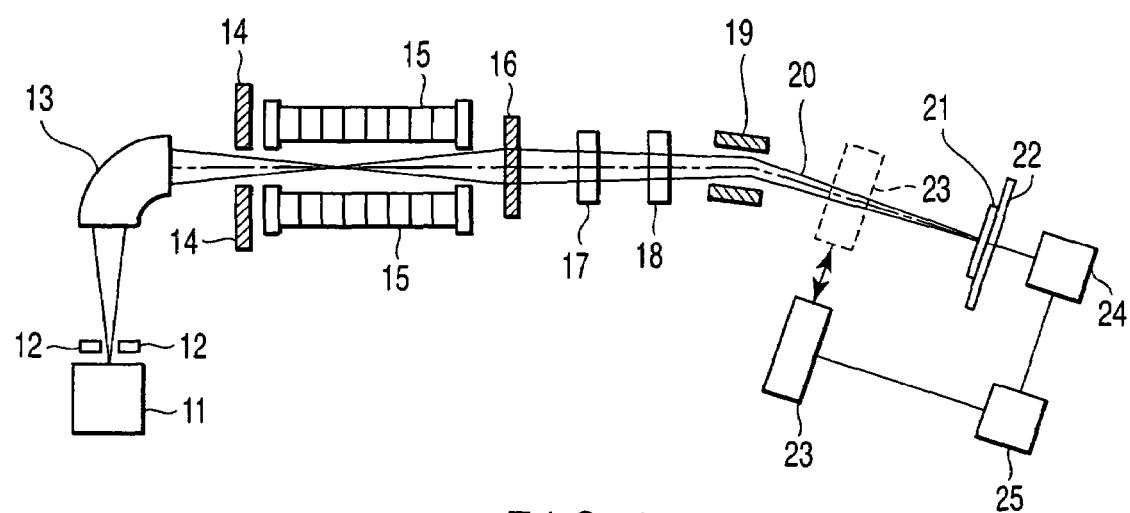
FIG. 2 is a diagram schematically showing an ion implanter according to an embodiment.

An ion implanter and a method of manufacturing a semiconductor device according to the present embodiment are provided taking the above cause into account. FIG. 2 is a diagram schematically showing the ion implanter according to the present embodiment.

First, an ion source chamber 11 generates a plurality of ions, which are then drawn by a drawer electrode 12 to become a beam. A separation electromagnet 13 subjects the plurality of ions to mass separation. The ions are selected from, for example, $A_s^+$ ions, $B^+$ ions, $BF^{2+}$ ions, $P^+$ ions, $Ge^+$ ions, $Sb^+$ ions, In, $Ga^+$ ions, $F^+$ ions, $N^+$ ions, $C^+$ ions, $BF^+$ ions and cluster ions including one of the those ions.

The ion source chamber 11 comprises a chamber into which an ion source gas is introduced and a cathode filament provided in the chamber and to which a voltage (power) is applied by a voltage source (power source) to emit thermal electrons.

Subsequently, the ions are completely separated by a slit 14 into beam-like ions (ion beam). An accelerator 15 then uses acceleration and deceleration or no loads to control the ion beam so that they have a predetermined final energy. Then, the ion beam is focused by a quadrupole lens 16 so as to have a focal point on a front surface (main surface) of a semiconductor wafer 21.

Subsequently, the ion beam is scan by scanning electrodes 17 and 18 so that the amount of beam to be implanted is uniformly distributed all over an implantation surface of the semiconductor wafer 21. To remove neutral particles resulting from collision with a residual gas, the ion beam is bent by a polarizing electrode 19. The ion beam 20 bent by the polarizing electrode 19 are implanted into the semiconductor wafer 21 set on a stage.

The present embodiment further comprises a center-of-gravity eccentricity measuring mechanism 23 that measures the amount of eccentricity of the center of gravity of the ion beam 20 and a stage driving mechanism 24 that changes the three-dimensional posture (position) of the stage 22 so that the direction of the eccentricity of the center of gravity of the ion beam 20 coincide with a direction perpendicular to the surface of the semiconductor wafer 21, on the basis of the amount of eccentricity of the center of gravity of the ion beam 20 measured by the center-of-gravity eccentricity measuring mechanism 23.

The stage driving mechanism 24 comprises a mechanism that can accurately drive the stage 22 in the directions of an X and Y axes or an X, Y, and Z axes. The mechanism has a gonio with respect to each operation axis. The center-of-gravity eccentricity measuring mechanism 23 is stored, using a moving mechanism (not shown), in an apparatus located away from an ion beam line except during measurements.

For a single wafer processing type ion implanter, the normal stage driving mechanism is used as the stage driving mechanism 24. On the other hand, a batch type ion implanter generally does not comprise the stage driving mechanism 24. Even if the batch type ion implanter comprises a stage driving mechanism, its control range is narrow, so that an exclusive stage driving mechanism 24 must be provided.

Figure 3:
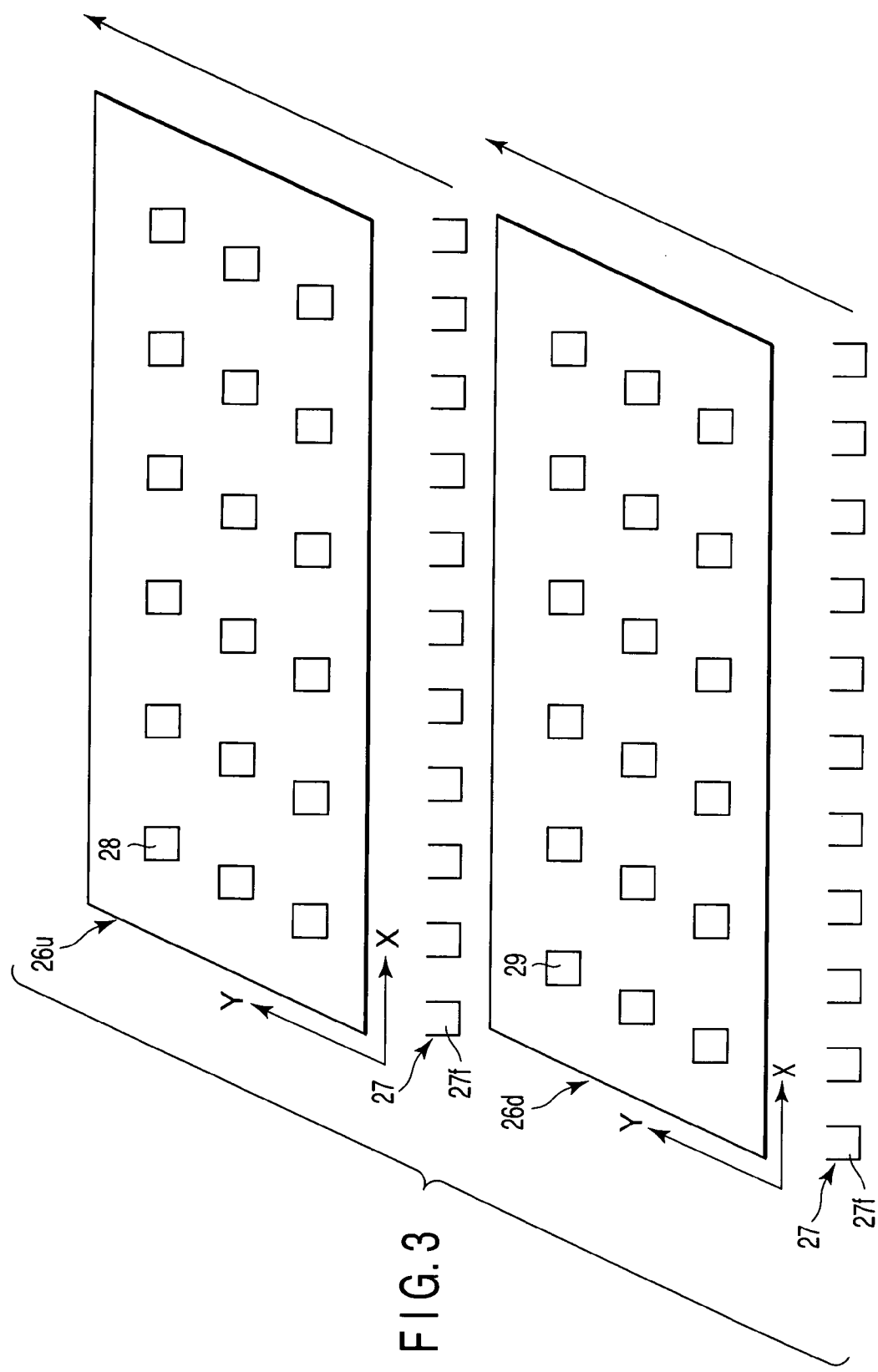
FIG. 3 is a diagram schematically showing a center-of-gravity eccentricity measuring mechanism of the ion implanter according to the embodiment.

The center-of-gravity eccentricity measuring mechanism 23 comprises two slits 26u and 26d and current detecting mechanisms 27 provided below the respective slits 26u and 26d as shown in FIG. 3. The slit 26u comprises a plurality of openings 28 arranged in a matrix (6×3). In the slit 26u, reference numeral 28 is shown only at one opening for simplification. Similarly, the slit 26d comprises a plurality of openings 29 arranged in a matrix (6×3).

Figure 4A:
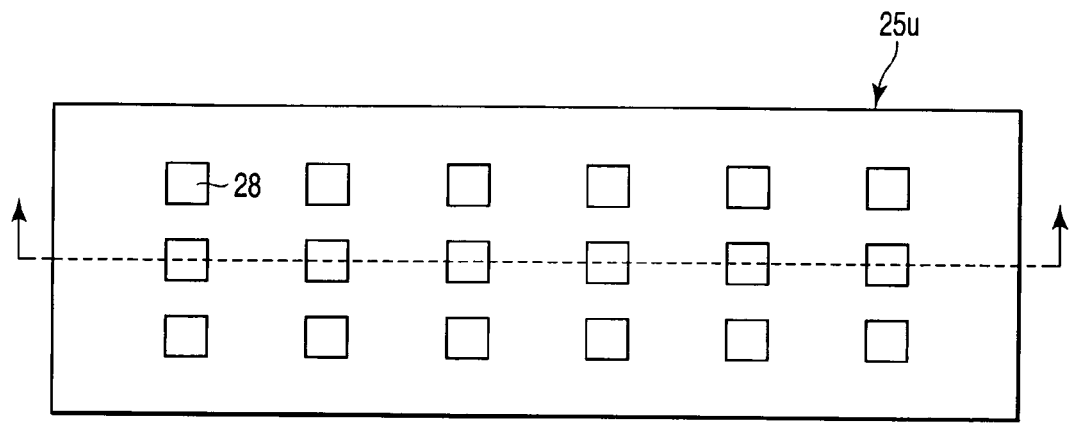
FIGS. 4A and 4B are plan views showing slits of the center-of-gravity eccentricity measuring mechanism of the ion implanter according to the embodiment.
Figure 4B:
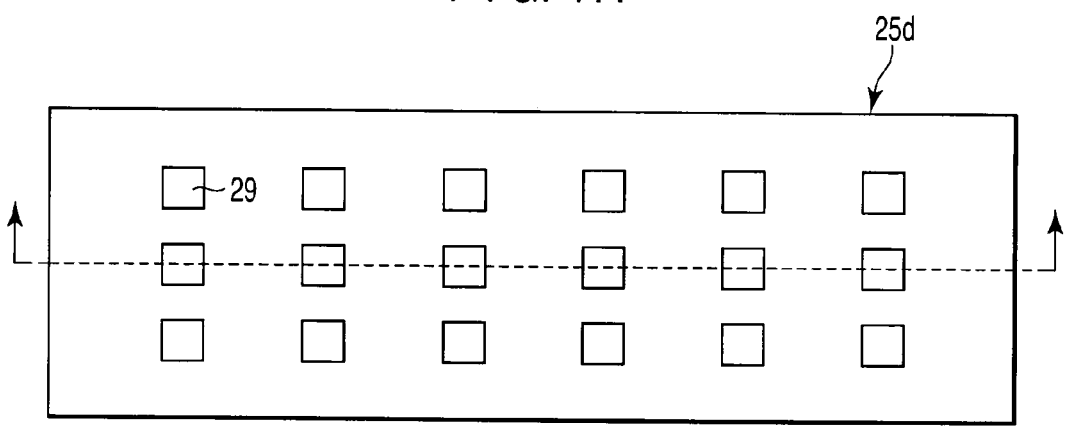
Figure 5:
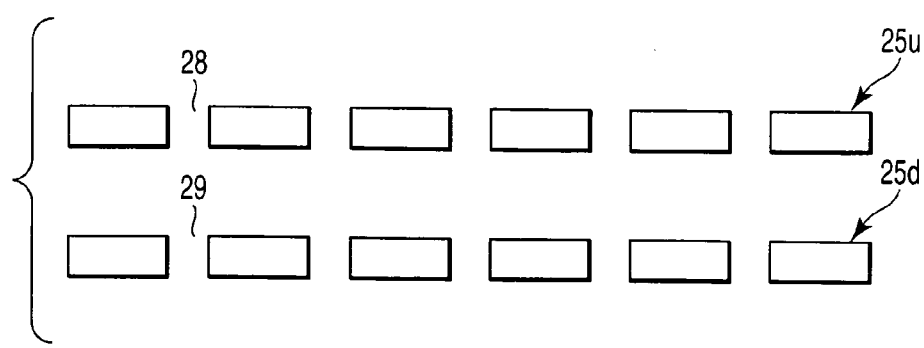
FIG. 5 is a sectional view showing the slits of the center-of-gravity eccentricity measuring mechanism of the ion implanter according to the embodiment.

FIGS. 4A and 4B are plan views of the slits 26u and 26d, respectively. FIG. 5 is a sectional view of the slits 26u and 26d as viewed from the direction of arrows in FIGS. 4A and 4B. As shown in FIGS. 4A, 4B, and 5, the slits 26u and 26d are the same. The slits 26u and 26d are arranged so that each opening 29 in the slit 26d is located below the corresponding opening 28 in the slit 26u. Accordingly, ions vertically entering the opening 28 also vertically enter the opening 29 located below the opening 28. In this case, the openings 28 and 29 appear to be rectangular in the plan views but may have a different shape such as a circle.

The current detecting mechanism 27 comprises a plurality of Faraday cup 27f arranged in a line in an X direction. In FIG. 3, reference numeral 27f is shown only at one Faraday cup for simplification. The current detecting mechanism 27 is scanned by a scanning mechanism (not shown) in a Y direction. Thus, the current of the ion beam passing through the slits 26u and 26b can be detected using Faraday cups 27f the number of which corresponds to only one row.

Figure 6:
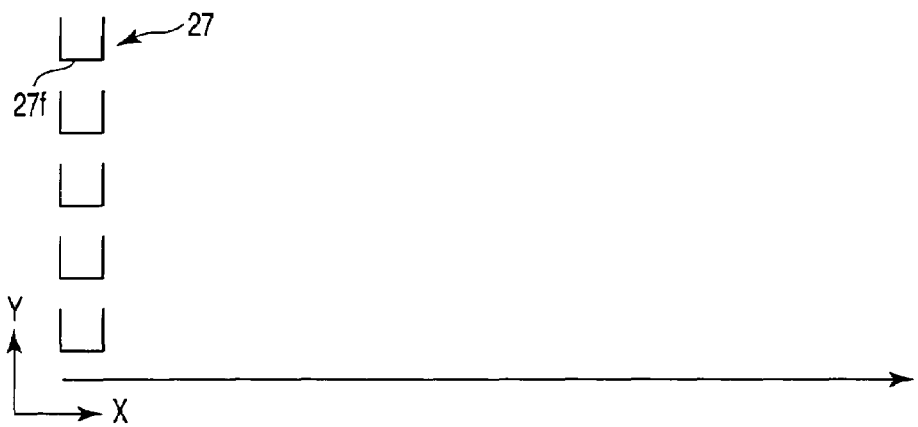
FIG. 6 is a diagram illustrating a variation of a current detecting mechanism of the center-of-gravity eccentricity measuring mechanism of the ion implanter according to the embodiment.
Figure 7:
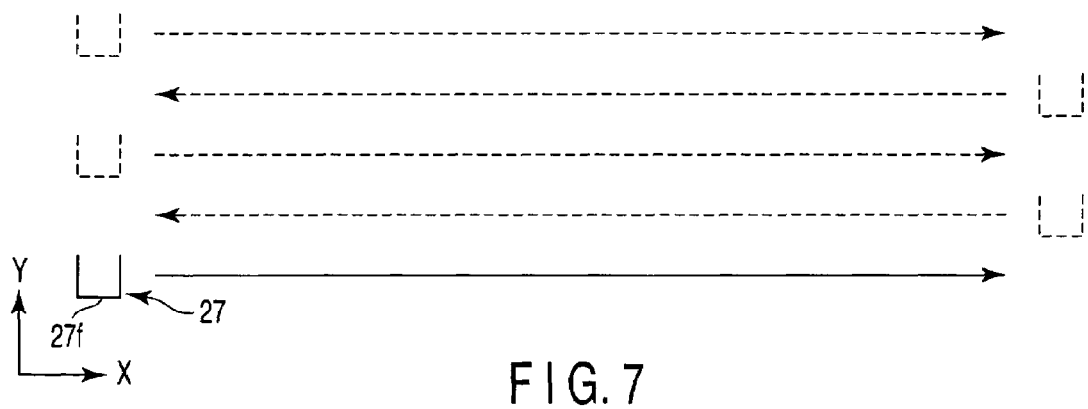
FIG. 7 is a diagram illustrating another variation of the current detecting mechanism of the center-of-gravity eccentricity measuring mechanism of the ion implanter according to the embodiment.

In this case, the plurality of Faraday cups 27f are arranged in a line in the X direction. However, as shown in FIG. 6, the plurality of Faraday cups 27f may be arranged in a line in the Y direction. In this case, the current detecting mechanism 27 is scanned by the scanning mechanism (not shown) in the X direction. Alternatively, as shown in FIG. 7, it is allowable to use only one Faraday cup 27f. In this case, the current detecting mechanism 27 is scanned by the scanning mechanism (not shown) in the X and Y direction as shown in FIG. 7.

Now, description will be given of a method of determining the amount of eccentricity of the center of gravity of the ion beam 20.

FIGS. 8 to 15 are diagrams illustrating a method of adjusting the stage 22 of the ion implanter according to the present embodiment.

Figure 8:
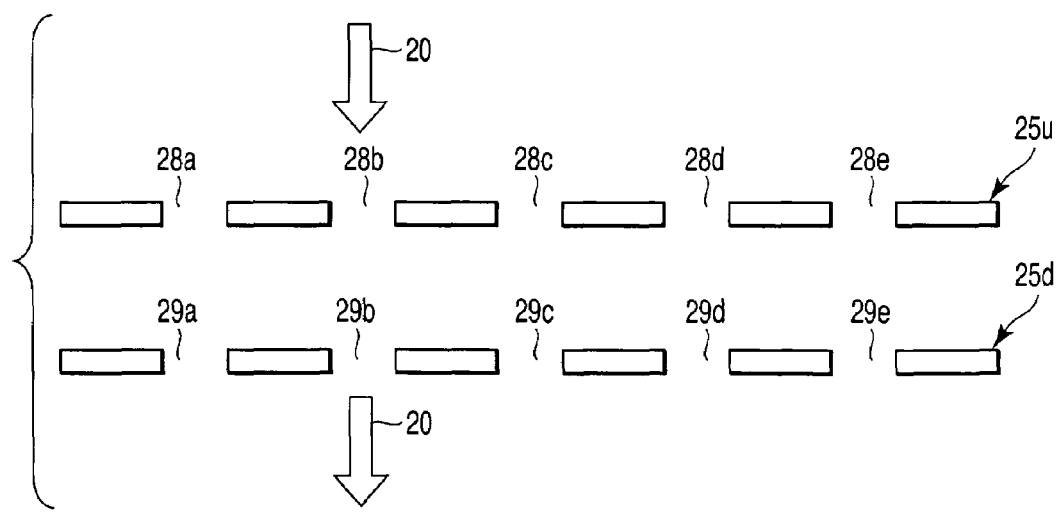
FIG. 8 is a diagram illustrating a method of adjusting a stage of the ion implanter according to the embodiment.

FIG. 8 is a diagram schematically showing how the ion beam 20 with no eccentricity of the center of gravity passes through the slits 25u and 25d. Reference numerals 28a to 28e and 29a to 29e denote openings. The ion beam 20 passing through the opening 28b in the slit 25u passes directly through the opening 29b in the slit 25d.

Thus, the amount of current in the ion beam 20 under the opening 28b detected by the current detecting mechanism 27 is substantially the same as the amount of current in the ion beam 20 under the opening 29b detected by the current detecting mechanism 27.

Figure 9:
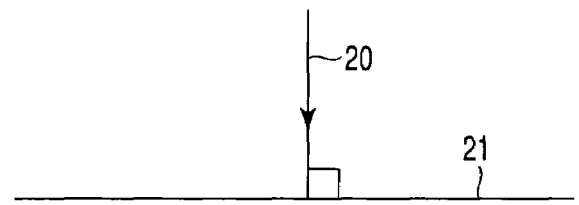
FIG. 9 is a diagram illustrating the method of adjusting the stage of the ion implanter according to the embodiment.

With this result of measurement, the direction in which the ion beam 20 flies is determined to be parallel to a line (normal) perpendicular to the surface (main surface) of the semiconductor wafer 21 as shown in FIG. 9. Accordingly, the controller 25 gives the stage driving mechanism 24 no instructions on adjustment of the posture (position) of the stage 22.

Figure 10:
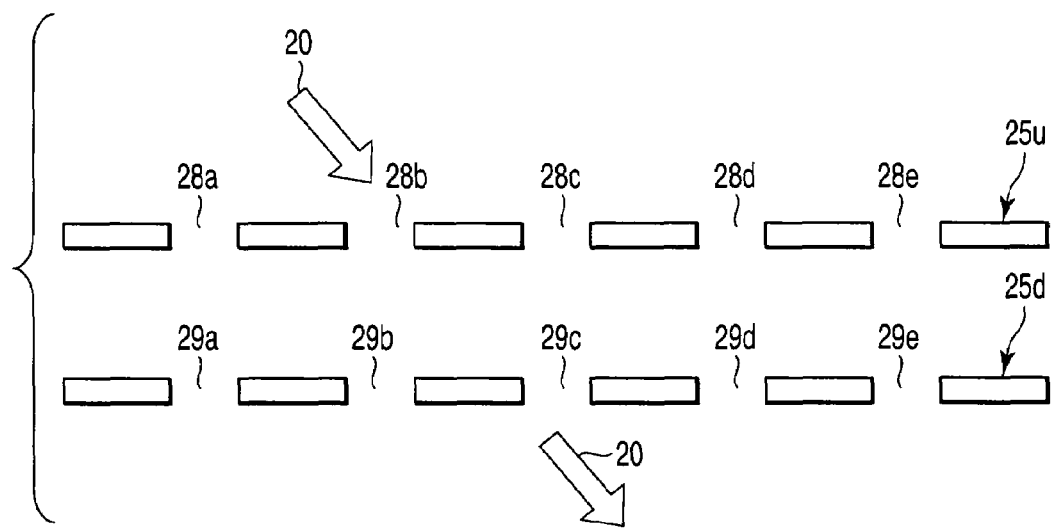
FIG. 10 is a diagram illustrating a method of adjusting a stage of the ion implanter according to the embodiment.

FIG. 10 is a diagram schematically showing how the ion beam 20 with a certain amount of eccentricity of the center of gravity passes through the slits 25u and 25d. In FIG. 10, the ion beam 20 passing through the opening 28b in the slit 25u flies downward and rightward and then passes through the opening 29c in the slit 25d.

Thus, the amount of current in the ion beam 20 under the opening 28b detected by the current detecting mechanism 27 is larger than that (in this case, substantially zero) in the ion beam 20 under the opening 29b detected by the current detecting mechanism 27. Further, the amount of current (in this case, substantially zero) in the ion beam 20 under the opening 28c detected by the current detecting mechanism 27 is smaller than that in the ion beam 20 under the opening 29c detected by the current detecting mechanism 27.

Figure 11:
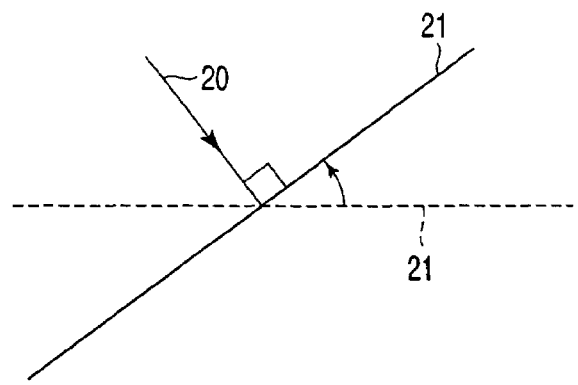
FIG. 11 is a diagram illustrating the method of adjusting the stage of the ion implanter according to the embodiment.

With this result of measurement, the direction in which the ion beam 20 flies is determined to be unparallel to the normal of the semiconductor wafer 21 at its initial position (the position shown by a broken line) as shown in FIG. 11. Thus, the controller 25 controls the stage driving mechanism 24 so that the flying direction of the ion beam 20 is parallel to the normal of the semiconductor wafer 21 as shown in FIG. 11. That is, in accordance with an instruction from the controller 25, the stage driving mechanism 24 changes the posture (position) of the stage 22 so that the flying direction of the ion beam 20 is parallel to the normal of the semiconductor wafer 21.

In the description of FIGS. 8 to 11, for simplification, the ion beam 20 comprises one ion beam having a single amount of eccentricity of the center of gravity, and the ion beam passes through the one opening in the slit. In the description below, the ion beam 20 comprises two ion beams having different amounts of eccentricity of the center of gravity, and the ion beams pass through the different openings of the slit.

Figure 12:
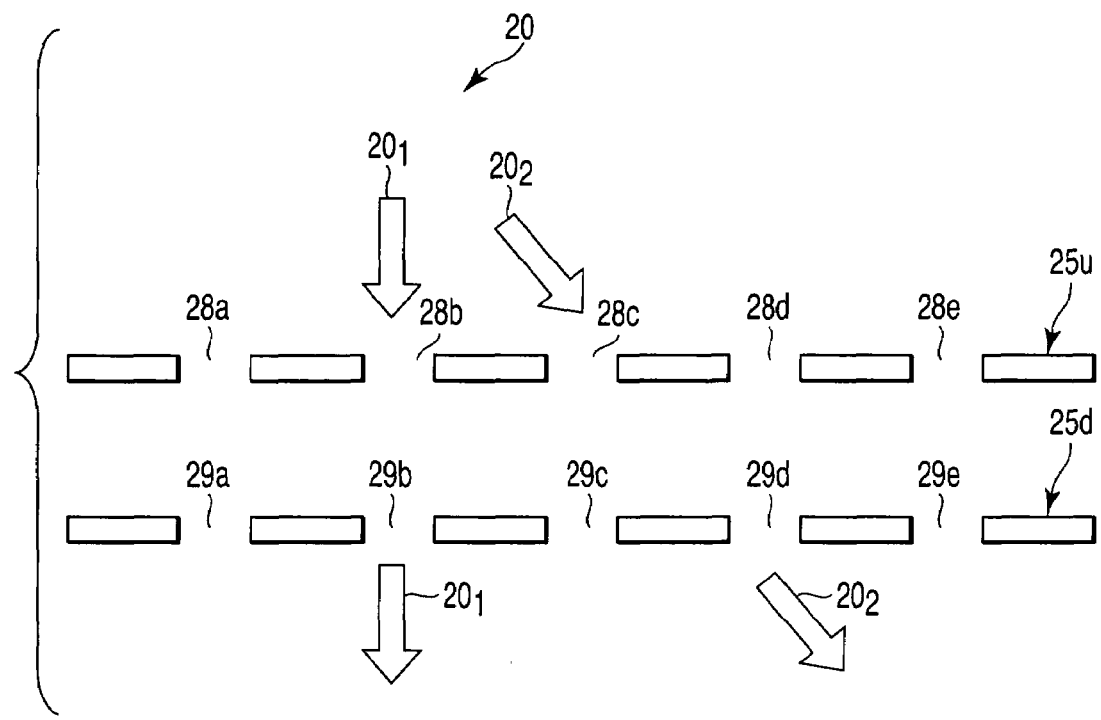
FIG. 12 is a diagram illustrating the method of adjusting the stage of the ion implanter according to the embodiment.

FIG. 12 is a diagram schematically showing how the ion beam 20 containing an ion beam $20_1$ with no eccentricity of the center of gravity and an ion beam $20_2$ with a certain amount of eccentricity of the center of gravity passes through the slits 25u and 25d. The amount of current in the ion beam $20_1$ entering the opening 28b is substantially the same as the amount of current in the ion beam $20_2$ entering the opening 28c.

In FIG. 12, the ion beam $20_1$ passing through the opening 28b passes directly through the opening 29b, while the ion beam $20_2$ passing through the opening 28c flies downward and rightward and then passes through the opening 29d.

Thus, the amount of current in the ion beam $20_1$ under the opening 28b detected by the current detecting mechanism 27 is substantially the same as the amount of current in the ion beam $20_1$ under the opening 29b detected by the current detecting mechanism 27. On the other hand, the amount of current in the ion beam $20_2$ under the opening 28c detected by the current detecting mechanism 27 is larger than that (in this case, substantially zero) in the ion beam $20_2$ under the opening 29c detected by the current detecting mechanism 27. Further, the amount of current (in this case, substantially zero) in the ion beam $20_2$ under the opening 28d detected by the current detecting mechanism 27 is smaller than that in the ion beam $20_2$ under the opening 29d detected by the current detecting mechanism 27.

Figure 13:
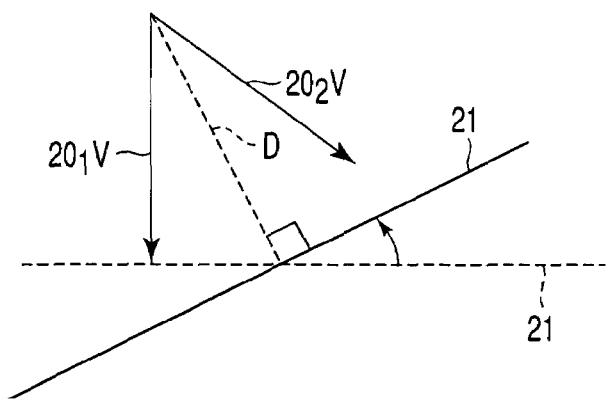
FIG. 13 is a diagram illustrating the method of adjusting the stage of the ion implanter according to the embodiment.

Here, as shown in FIG. 13, a first vector $20_1 V$ is defined to have a magnitude and a direction corresponding to the amount of current and the flight direction, respectively, of the ion beam $20_1$ under the opening in the slit 25u before passage through the slit 25d. Likewise, a second vector $20_2 V$ is defined to have a magnitude and a direction corresponding to the amount of current and the flight direction, respectively, of the ion beam $20_2$ under the opening in the slit 25u before passage through the slit 25d. The direction D of the synthetic vector of the first and second vectors can be considered to be the flying direction of the whole ion beam 20 containing the ion beams 201 and 202. That is, in the present embodiment, the flying directions of the ion beams $20_1$ and $20_2$ are weighted by the amounts of current to calculate the flying direction of the whole ion beam 20.

As shown in FIG. 13, the direction D of the synthetic vector is determined to be unparallel to the normal of the semiconductor wafer 21 at the initial position (the position shown by a broken line). Thus, as shown in FIG. 13, the stage driving mechanism 2.4 changes the posture (position) of the stage 22 so that the flying direction D of the synthetic vector is parallel to the normal of the semiconductor wafer 21.

Figure 14:
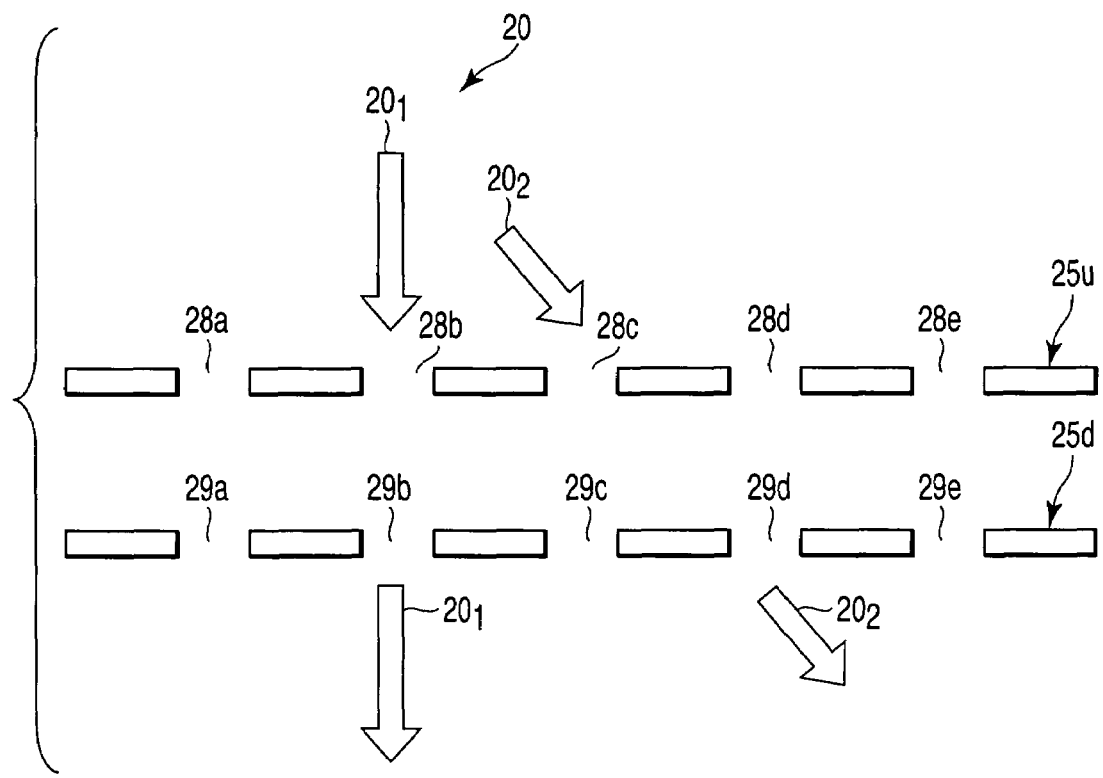
FIG. 14 is a diagram illustrating the method of adjusting the stage of the ion implanter according to the embodiment.

FIG. 14 is a diagram schematically showing how the ion beam $20_1$ with no eccentricity of the center of gravity and the ion beam $20_2$ with a certain amount of eccentricity of the center of gravity pass through the slits 25u and 25d. The amount of current in the ion beam $20_1$ is larger than the amount of current in the ion beam $20_2$. The amount of current in the ion beam $20_1$ under the opening 29b is larger than the amount of current in the ion beam $20_2$ under the opening 29d.

Figure 15:
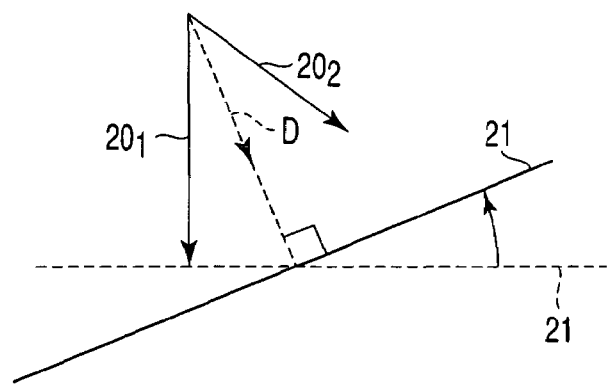
FIG. 15 is a diagram illustrating the method of adjusting the stage of the ion implanter according to the embodiment.

In this case, as shown in FIG. 15, the direction D of the synthetic vector is determined to be unparallel to the normal of the semiconductor wafer 21 at the initial position (the position shown by a broken line). Thus, in accordance with an instruction from the controller 25, the stage driving mechanism 24 changes the posture (position) of the stage 22 so that the flying direction D of the synthetic vector is parallel to the normal of the semiconductor wafer 21 as shown in FIG. 15.

As described above, in general, the posture (position) of the stage 22 may be controlled as follows. If the ion beam 20 enter n ($\geq 1$) openings of the slit 25u, when the magnitude of a vector corresponds to the amount of current in the ion beam passing through each opening and the direction of the vector corresponds to the direction of the ion beam passing through the opening, then the posture (position) of the stage 22 is controlled so that the direction of the synthetic vector of the vectors passing through the openings is parallel to the normal of the semiconductor wave 21.

When ions are implanted by controlling the posture (position) of the stage 22 as described above, the asymmetry (the degradation of the element characteristics) of the characteristics of the horizontal MOS transistor 2 of gate length (channel length) not higher than 65 nm is confirmed to be sufficiently improved.

In the prior art, the asymmetry is notable if acceleration energy is not higher than 3 keV or if a dose amount is not less than $1\times10^{14}$ cm$^{-2}$ or if the acceleration energy is not higher than 3 keV and the dose amount is not less than $1\times10^{14}$ cm$^{-2}$. However, the present embodiment has been confirmed to sufficiently suppress the asymmetry under any of the above ion implantation conditions.

The asymmetry is sufficiently suppressed because the ion implanter and method of ion implantation according to the present embodiment sufficiently eliminate a variation in the incident angle of ion beam caused by eccentricity of the center of gravity of the ion beam. It has also been confirmed to be possible to reduce the above variation below, for example, a variation in the angle between a side of a gate electrode which is processed to extend in a substantially vertical direction and the normal line of the surface (main surface) of the wafer or a variation in the angle between that side of a connection hole formed in an insulating film which is processed to extend in a substantially vertical direction and the normal line of a bottom surface of the connection hole.

SECOND EMBODIMENT

Figure 16:
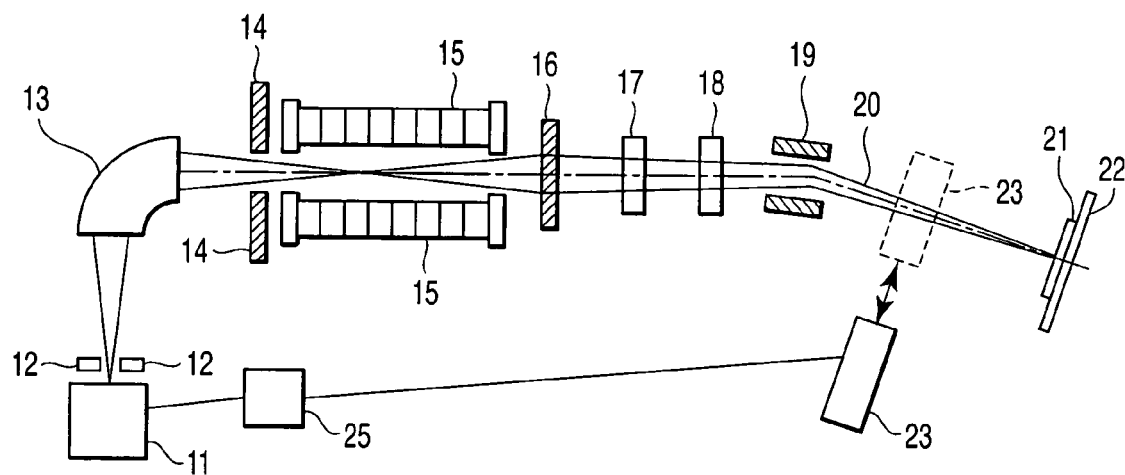
FIG. 16 is a diagram schematically showing the ion implanter according to an embodiment.
Figure 17:
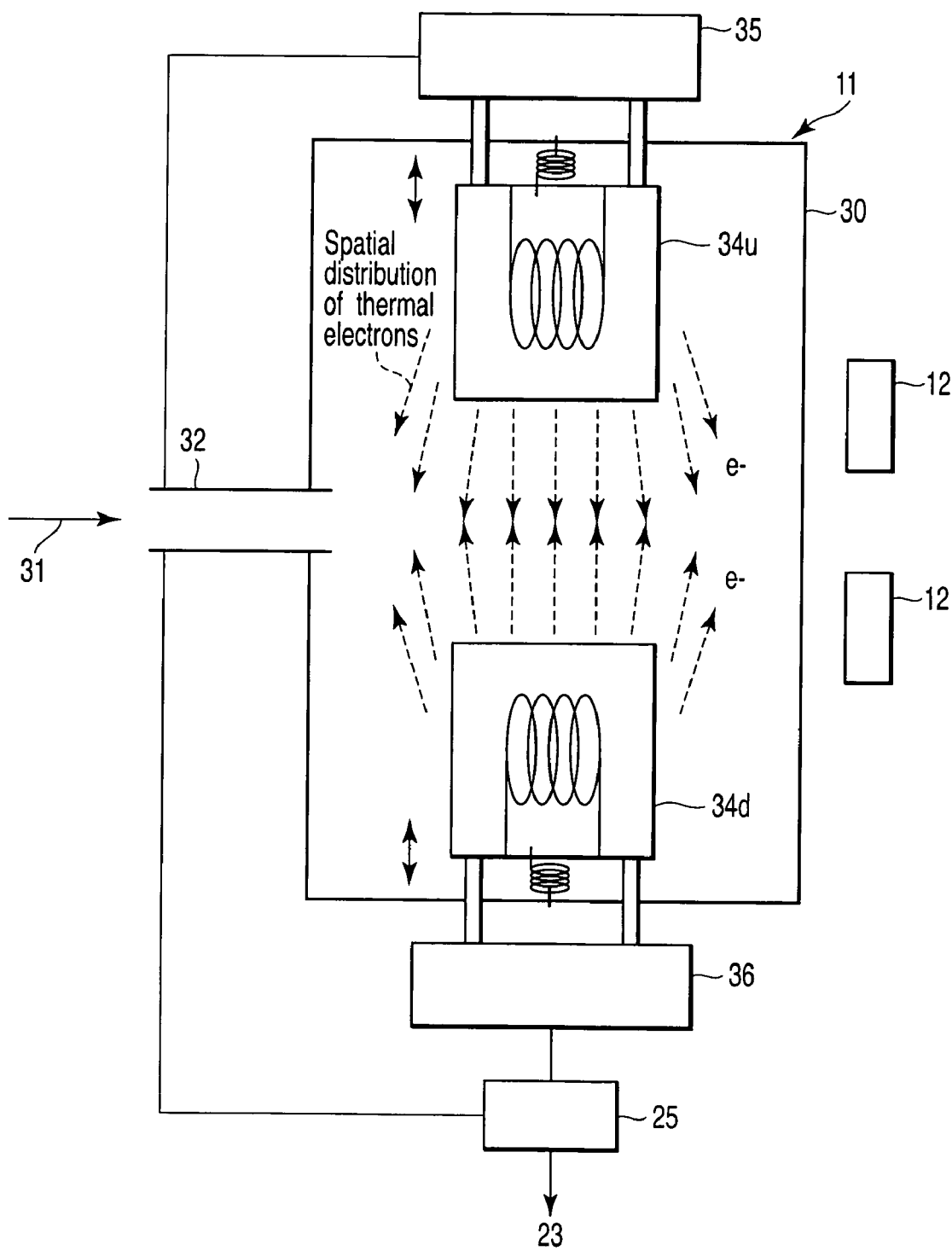
FIG. 17 is a diagram schematically showing an ion chamber of the ion implanter according to the embodiment.

FIG. 16 is a diagram schematically showing an ion implanter according to the second embodiment of the present invention. FIG. 17 is a diagram schematically showing the configuration of an ion source chamber of the ion implanter according to the present embodiment. Parts of this ion implanter which correspond to those in FIG. 2 are denoted by the same reference numerals, with their detailed description omitted.

As previously described, eccentricity of the center of gravity of ion beam is considered to result from the spatial distribution of thermal electrons emitted from the cathode filament in the ion source chamber. Thus, in the present embodiment, the eccentricity of the center of gravity of the ion beam 20 is controlled by controlling the spatial distribution 37 of thermal electrons in the ion source chamber 11. The present embodiment will further be described below.

In FIG. 17, reference numeral 30 denotes a chamber. A gas introduction pipe 32 is provided in a wall of the chamber 30 to introduce an ion source gas 31 such as BF$_3$ or AsF$_3$. Discharge apparatuses 34*u* and 34*d* are provided in the chamber 30 and each comprise a cathode filament 33 that emits thermal electrons when a voltage source (power source; not shown) applies a voltage (power) to the filament 33. The discharge apparatus 34*u* is provided at a upper position in the chamber 30, while the discharge apparatus 34*d* is provided at a lower position in the chamber 30. The discharge apparatus 34*u* can be moved up and down by a driving mechanism 35. Likewise, the discharge apparatus 34*d* can be moved up and down by a driving mechanism 36.

In a state that the ion source gas 31 has been introduced into the chamber 30 from the gas introduction pipe 32, the discharge apparatuses 34*u* and 34*d* causes discharge to generate B, As, or other ions. The ions are drawn by the drawer electrode 12.

According to the present embodiment, the spatial distribution 37 of thermal electrons can be controlled by using the driving mechanisms 35 and 36 to control the positions of the discharge apparatuses 34*u* and 34*d*, that is, the cathode filaments 33. On the other hand, the amount of eccentricity of the center of gravity of ion beam can be measured using the center-of-gravity eccentricity measuring mechanism 23.

The amount of eccentricity of the center of gravity of ion beam measured by the center-of-gravity eccentricity measuring mechanism 23 is transmitted to the controller 25. The controller 25 controls the driving mechanisms 35 and 36 so that the amount of eccentricity becomes equal to or smaller than a predetermined value. Such feedback control enables the spatial distribution 37 of thermal electrons to be controlled so that the eccentricity of the center of gravity of ion beam becomes sufficiently small.

When ions are implanted by controlling the spatial distribution 37 of thermal electrons as described above, the asymmetry of the characteristics of the horizontal MOS transistor 2 of gate length (channel length) not higher than 65 nm is confirmed to be sufficiently improved.

In the prior art, the asymmetry is notable if the acceleration energy is not higher than 3 keV or if the dose amount is not less than $1\times10^{14}$ cm$^{-2}$ or if the acceleration energy is not higher than 3 keV and the dose amount is not less than $1\times10^{14}$ cm$^{-2}$. However, the present embodiment has been confirmed to sufficiently suppress the asymmetry under any of the above ion implantation conditions.

The asymmetry is sufficiently suppressed because the ion implanter and method of ion implantation according to the present embodiment sufficiently reduce a variation in the incident angle of ion beam caused by eccentricity of the center of gravity of the ion beam. It has also been confirmed to be possible to reduce the above variation below, for example, a variation in the angle between a side of a gate electrode which is processed to extend in a substantially vertical direction and the normal line of the surface (main surface) of the wafer or a variation in the angle between that side of a connection hole formed in an insulating film which is processed to extend in a substantially vertical direction and the normal line of a bottom surface of the connection hole.

The present invention is not limited to the above embodiments. For example, the first and second embodiments may be combined together. Moreover, the present invention is applicable to diffusion layers other than the source/drain diffusion layer of the MOS transistor.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An ion implanter comprising:
   a sample stage for setting a sample having a main surface;
   an ion generating section configured to generate a plurality of ions, the ion generating section including a container into which an ion source gas is introduced and a filament for emitting thermal electrons provided in the container;
   an implanting section configured to implant an ion beam containing the plurality of ions in the main surface of the sample; and
   a control section configured to control a position of the sample or a spatial distribution of electrons emitted from the filament so that a direction of eccentricity of a center of gravity of the ion beam coincides with a direction of a normal line of the main surface.

2. The ion implanter according to claim 1, wherein the control section configured to control the position of the sample comprises a changing section which changes a position of the sample stage; a measuring section which measures the direction of eccentricity of the center of gravity of the ion beam before the ion beam is implanted into the main surface of the sample; and a control section which controls the changing section so that the direction of eccentricity of the center of gravity of the ion beam coincides with the direction of the normal of the main surface of the sample based on the direction of eccentricity of the center of gravity of the ion beam measured by the measuring section.

3. The ion implanter according to claim 1, wherein the control section configured to control the position of the sample comprises
a changing section which changes a position of the sample stage;
a first slit to be irradiated with the ion beam, the first slit having a plurality of openings;
a second slit to be irradiated with an ion beam passing through the first slit, the second slit having a plurality of openings;
a measuring section which measures an amount of current of an ion beam under the plurality of openings of the first slit, the ion beam being passing through the first slit and before passing through the second slit and measuring an amount of current of an ion beam under the plurality of openings of the second slit, the ion beam being passing through the second slit and before being implanted into the main surface of the sample; and
a control section comprising: calculating a plurality of vectors for the plurality of openings of the first slit based on current values of the ion beam under the plurality of openings of the first and second slits measured by the measuring section, the plurality of vectors having magnitudes and directions corresponding to current values and directions of the ion beam passing through the plurality of openings of the first slit; and controlling the changing section so that a direction of eccentricity of the center of gravity of the ion beam coincides with the direction of the normal of the main surface, the direction of eccentricity of the center of gravity of the ion beam being obtained by summing the plurality of calculated vectors.

4. The ion implanter according to claim 3, wherein the number of the plurality of openings of the first slit is the same as that of the plurality of openings of the second slit, and the plurality of openings of the second slit are located below the plurality of openings of the first slit.

5. The ion implanter according to claim 4, wherein the plurality of ions are selected from $As^+$ ions, $B^+$ ions, $P^+$ ions, $Ge^+$ ions, $Sb^+$ ions, $In^+$ ions, $Ga^+$ ions, $F^+$ ions, $N^+$ ions, $C^+$ ions, $BF^+$ ions, and cluster ions including one of those ions.

6. The ion implanter according to claim 5, wherein the implanting section is capable of setting acceleration energy not higher than 3 keV, capable of setting dose amount not less than $1 \times 10^{14}$ $cm^{-2}$, or capable of setting acceleration energy and dose amount respectively not higher than 3 keV and not less than $1 \times 10^{14}$ $cm^{-2}$.

7. The ion implanter according to claim 1, wherein the control section configured to control the spatial distribution of electrons emitted from the filament comprises a changing section which changes the position of the filament; a measuring section which measures the direction of eccentricity of the center of gravity of the ion beam before the ion beam is implanted into the main surface of the sample; and a control section which controls the changing section so that the direction of eccentricity of the center of gravity of the ion beam coincides with the direction of the normal of the main surface of the sample based on the direction of eccentricity of the center of gravity of the ion beam measured by the measuring section.

8. The ion implanter according to claim 7, wherein the plurality of ions are selected from $As^+$ ions, $B^+$ ions, $P^+$ ions, $Ge^+$ ions, $Sb^+$ ions, $In^+$ ions, $Ga^+$ ions, $F^+$ ions, $N^+$ ions, $C^+$ ions, $BF^+$ ions, and cluster ions including one of those ions.

9. The ion implanter according to claim 8, wherein the implanting section is capable of setting acceleration energy not higher than 3 key, capable of setting dose amount not less than $1 \times 10^{14}$ $cm^{-2}$, or capable of setting acceleration energy and dose amount respectively not higher than 3 keV and not less than $1 \times 10^{14}$ $cm^{-2}$.

10. A method of manufacturing a semiconductor device comprising:
generating a plurality of ions by an ion generating section including a container into which an ion source gas is introduced and a filament for emitting thermal electrons provided in the container, the plurality of ions being generated in the container;
controlling a position of a sample or a spatial distribution of electrons emitted from the filament so that a direction of eccentricity of the center of gravity of ion beam containing the plurality of ions coincides a direction of a normal of a main surface; and
implanting the ion beam into the main surface of the sample set on a sample stage.

11. The method according to claim 10, wherein implanting the ion beam into the main surface of the sample set on the sample stage is an ion implantation for forming a source/drain diffusion layer of a horizontal MOS transistor having a gate length not larger than 65 nm.

12. The method according to claim 11, wherein the plurality of ions are selected from $As^+$ ions, $B^+$ ions, $P^+$ ions, $Ge^+$ ions, $Sb^+$ ions, $In^+$ ions, $Ga^+$ ions, $F^+$ ions, $N^+$ ions, $C^+$ ions, $BF^+$ ions, and cluster ions including one of those ions.

13. The method according to claim 12, wherein the ion implantation is carried out under a condition that acceleration energy is not higher than 3 key.

14. The method according to claim 12, wherein the ion implantation is carried out under a condition that dose amount is not less than $1 \times 10^{14}$ $cm^{-2}$.

15. The method according to claim 12, wherein the ion implantation is carried out under conditions that acceleration energy is not higher than 3 key and a dose amount is not less than $1 \times 10^{14}$ $cm^{-2}$.

* * * * *

UNITED STATES PATENT AND TRADEMARK OFFICE
CERTIFICATE OF CORRECTION

PATENT NO.       : 7,247,867 B2
APPLICATION NO.  : 11/170171
DATED            : July 24, 2007
INVENTOR(S)      : Itokawa et al.

It is certified that error appears in the above-identified patent and that said Letters Patent is hereby corrected as shown below:

Column 10, line 20, change "3 key" to --3 keV--.

Column 10, line 50, change "3 key" to --3 keV--.

Signed and Sealed this

Twenty-third Day of October, 2007

JON W. DUDAS
*Director of the United States Patent and Trademark Office*